United States Patent [19]

Wind et al.

[11] 4,301,410

[45] Nov. 17, 1981

[54] SPIN IMAGING IN SOLIDS USING SYNCHRONOUSLY ROTATING FIELD GRADIENTS AND SAMPLES

[75] Inventors: Robert A. Wind, Zoetermeer, Netherlands; Costantino S. Yannoni, Los Gatos, Calif.

[73] Assignee: International Business Machines Corporation, Armonk, N.Y.

[21] Appl. No.: 79,778

[22] Filed: Sep. 28, 1979

[51] Int. Cl.$^3$ ............................................. G01N 27/00
[52] U.S. Cl. ................................... 324/307; 324/321
[58] Field of Search ....................... 324/300, 309–311, 324/318–320

[56] References Cited

U.S. PATENT DOCUMENTS

| | | |
|---|---|---|
| 3,474,329 | 10/1969 | Waugh . |
| 3,512,078 | 5/1970 | Hall . |
| 3,530,373 | 9/1970 | Waugh . |
| 3,588,677 | 6/1971 | Kleiman . |
| 3,792,346 | 2/1974 | Gibby . |
| 3,911,355 | 10/1975 | Leane . |
| 4,088,944 | 5/1978 | Engler . |
| 4,104,577 | 8/1978 | Greenwood . |

OTHER PUBLICATIONS

Lauterbur, Image Formation by Induced Local Interactions: Examples Employing Nuclear Magnetic Resonance, NATURE, 242, 190, (1973).

Mansfield et al, Biffraction and Microscopy in Solids and Liquids by NMR, Physical Review B, vol. 12, No. 9, Nov. 1, 1975, pp. 3618–3634.

Hinshaw, Image Formation by Nuclear Magnetic Resonance: The Sensitive-Point Method, J. Appl. Phys., vol. 47, No. 8, Aug. 1976, pp. 3709–3721.

*Primary Examiner*—Michael J. Tokar
*Attorney, Agent, or Firm*—Joseph E. Kieninger

[57] ABSTRACT

A method for spin imaging in solids using nuclear magnetic resonance (NMR) spectroscopy. The invention includes the steps of rotating the sample about an axis which makes a particular angle with the NMR static external magnetic field, rotating a magnetic field gradient with a spatial distribution which is related to the sample spinning axis synchronously with the sample, collecting the data while performing a solid state NMR line narrowing step, and changing the phase relation between the sample rotation and the field gradient rotation on a step-by-step basis to map out an image of the object.

6 Claims, 8 Drawing Figures

SPIN IMAGING IN SOLIDS USING SYNCHRONOUSLY ROTATING FIELD GRADIENTS AND SAMPLES

DESCRIPTION

1. Technical Field

This invention relates to nuclear magnetic resonance (NMR) spectroscopy and more particularly to a method for spin-imaging in solids using an NMR spectrometer.

It is a primary object of this invention to provide an improved NMR spectroscopy method.

It is another object of this invention to provide an improved method of spin-imaging NMR spectroscopy.

It is still another object of this invention to provide a method that provides a nondestructive image of the inside of an object.

It is yet still another object of this invention to provide a spin imaging method that lends itself to computer control.

2. Background Art

Normal NMR techniques rely on a homogeneous external magnetic field. In contrast, in spin-imaging with NMR spectrometers, a gradient is superimposed on a homogeneous magnetic field to produce an inhomogeneous field. Normally, this gradient field is static, that is, it is not changed or rotated with time.

Lauterbur in Nature, Vol. 242, p. 190 (1973) demonstrated the use of field gradients in NMR to obtain spin images of liquid-like materials. Lauterbur did not use either sample rotation or field gradient rotation; nor would his technique work on solids. He utilized data collection and image reconstruction techniques.

Hinshaw, in the Journal of Applied Physics, Vol. 7, No. 8, August 1976, pages 3709-3721, does spin-imaging with a gradient field which changes with time, including rotating the gradient field. Hinshaw does not rotate the sample, however. His technique is for liquid spin-imaging. Spin-imaging of solid materials is more difficult than spin-imaging of liquids because of the broad NMR line obtained with solids, which thereby limits its usefulness.

In solids, to achieve the narrow NMR lines required for spin imaging, it is necessary (1) to apply known NMR methods designed to reduce part of the broadening as described in U.S. Pat. Nos. 3,530,373, 3,530,374, 3,474,329 and 3,792,346, and (2) to spin the sample around a particular axis to remove other broadening effects not removable by step (1) as described by E. R. Andrew in M.T.P. Rev. Sci., Phys. Chem. Ser. 2, Vol. 4, 173 (1976).

BRIEF DESCRIPTION OF THE DRAWINGS

In the accompanying drawings forming a material part of this disclosure.

DISCLOSURE OF THE INVENTION

For further understanding of the invention and of the objects and advantages thereof, reference will be had to the following description and accompanying drawings, and to the appended claims in which the various novel features of the invention are more particularly set forth.

Accordingly, a method for spin-imaging in solids using nuclear magnetic resonance (NMR) spectroscopy is described. With this method, the spin density distribution of a two- or three-dimensional object such as a solid can be constructed resulting in an image of the sample. This method lends itself to computer control to map out an image of the object. This spin-imaging method involves the steps of placing a solid sample in the rf coil field and the external magnetic field of an NMR spectrometer. A magnetic field gradient is superimposed across the sample to provide a field gradient which results in a varying DC field that has different values over different parts of the sample. As a result, nuclei in different parts of the sample have different resonant NMR frequencies. The sample is rotated about an axis which makes a particular angle of 54.7° with the static external magnetic field. The magnetic field gradient which has a spatial distribution related to the sample spinning axis is then rotated synchronously with the sample. Data is then collected while performing a solid state NMR line narrowing procedure. The next step is to change the phase relation between the sample rotation and the field gradient rotation. The data is again collected as before while the sample and field gradient are synchronously rotated. The phase relation is changed a number of times and data collected each time. The spin image of the solid sample is then reconstructed from the collected data.

Best Mode for Carrying Out the Invention

Figure 1:
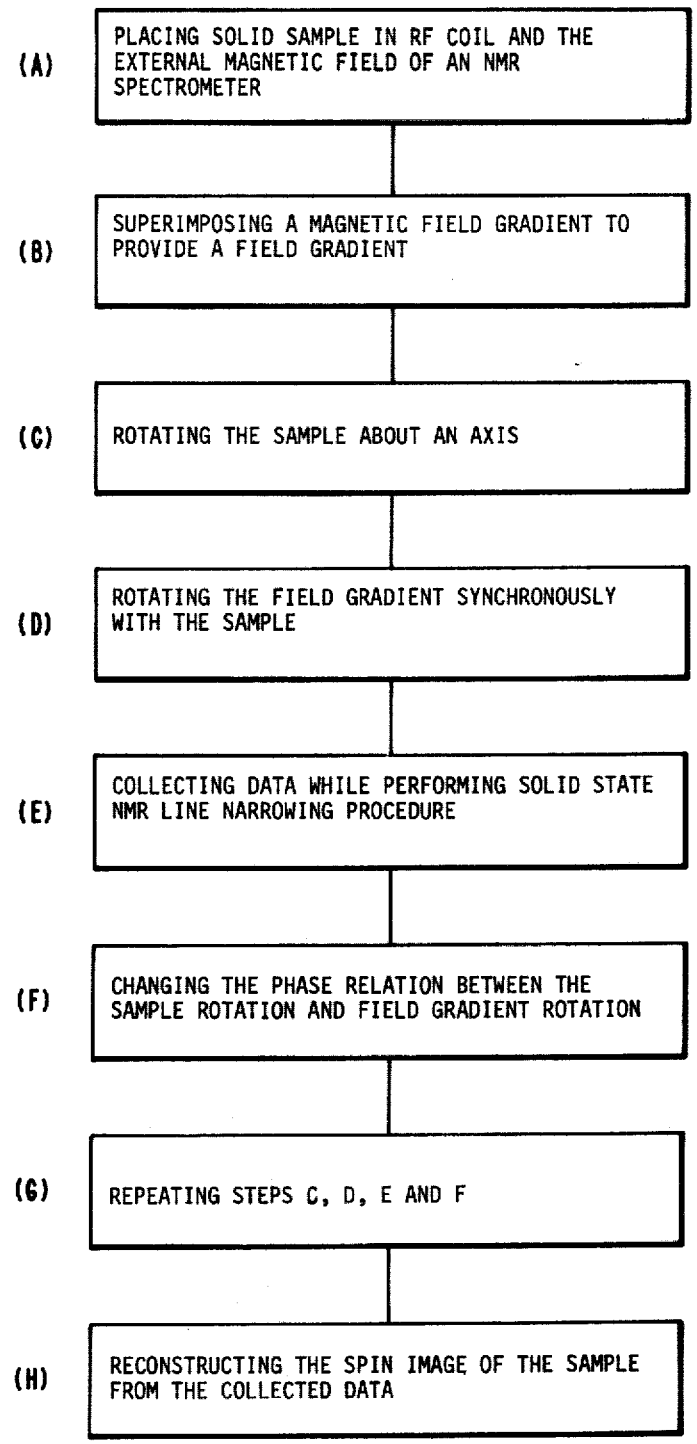
FIG. 1 is a flow diagram (A-H) of a method for spin-imaging in solids.
Figure 2:
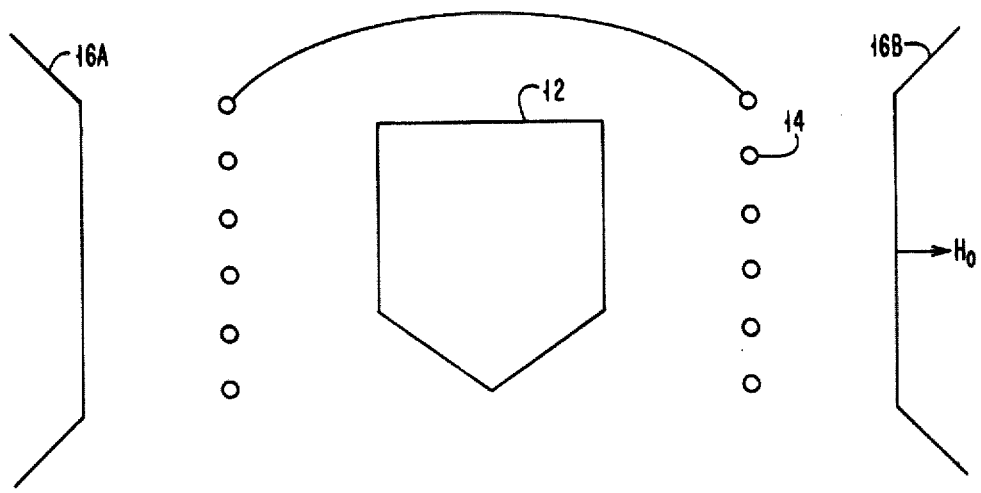
FIG. 2 is a cross-sectional view of the system at the first stage in a preferred embodiment.
Figure 3:
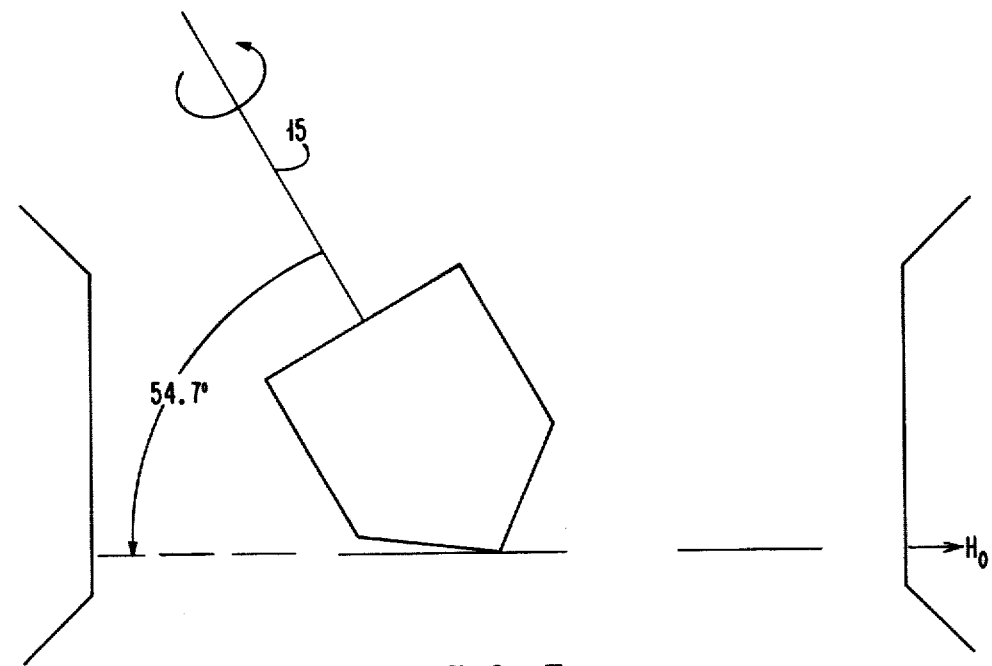
FIG. 3 is a cross-sectional side view illustrating the sample rotating about an axis.
Figure 4:
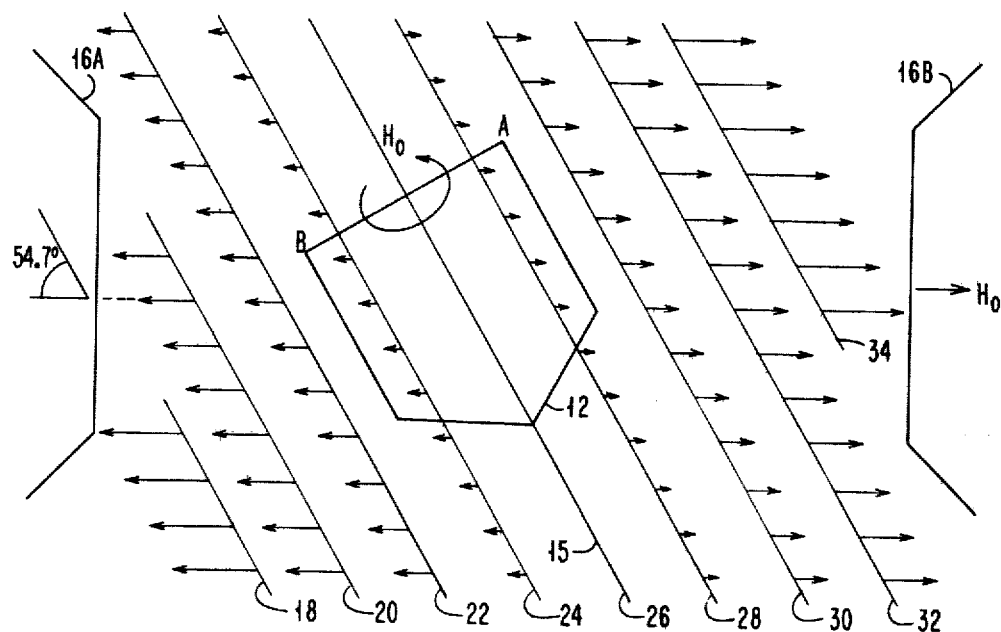
FIG. 4 is a cross-sectional view illustrating a field gradient in the sample area.

The steps of the method are summarized in FIG. 1 and illustrated in FIGS. 2-6C. As shown in FIG. 2, a solid sample is placed in the sample holder 12 which is positioned in an rf coil 14 and the external magnetic field formed by the magnetic poles 16A and 16B of the NMR spectrometer (not shown). The strength of the magnetic field is $H_O$ Gauss in the direction shown. A magnetic field gradient is superimposed across the sample to provide a field gradient which results in a DC field that has different values over different parts of the sample. An example of a field gradient is shown in FIG. 4.

As shown in FIG. 3, the sample holder is rotated about an axis 15. The axis 15 forms an angle of 54.7° with the direction of the static external magnetic field.

FIG. 4 shows a specific field gradient in the sample area. The length of the arrows in the figure indicates the strength of the magnetic field added to or subtracted from the external DC magnetic field, $H_O$. The planes of equal field strength 18, 20, 22, 24, 26, 28, 30, 32 and 34 are parallel to the rotation axis 15 of sample 12.

The strength of the magnetic field at points A and B of the sample holder 12 is different as shown.

Figure 5:
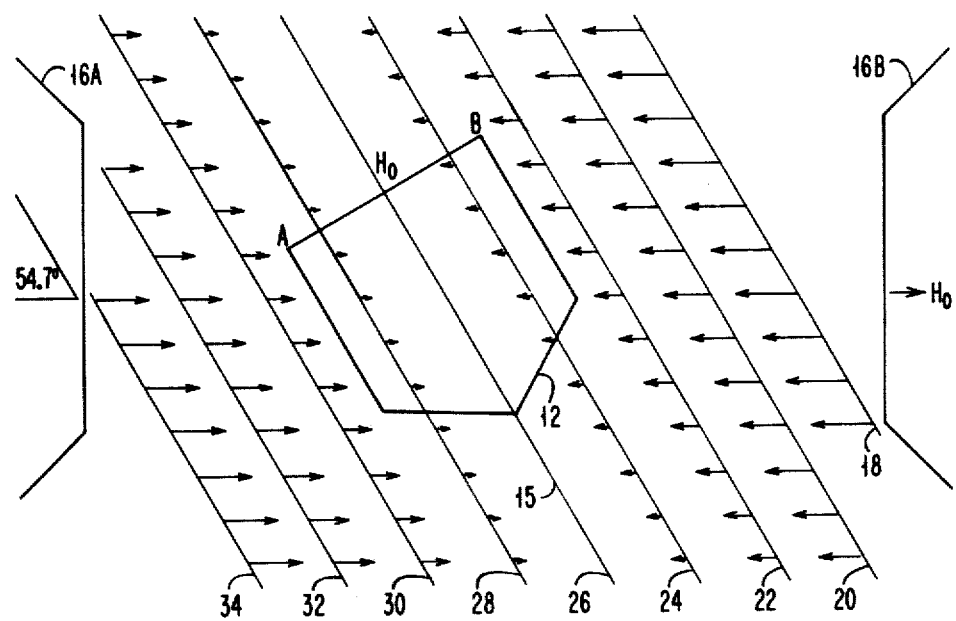
FIG. 5 is a cross-sectional view showing the synchronous rotation of the sample and the field gradient relative to FIG. 4.

FIG. 5 shows synchronous rotation of both the sample holder 12 and the field gradient as defined by the planes of equal field strength 18-34. The field strength of the sample holder 12 at points A and B are the same as in FIG. 4. Data is collected while performing a solid state NMR line narrowing procedure of the type described in the prior art section. The figure shows the situation half a rotation different from FIG. 4.

Figure 6A:
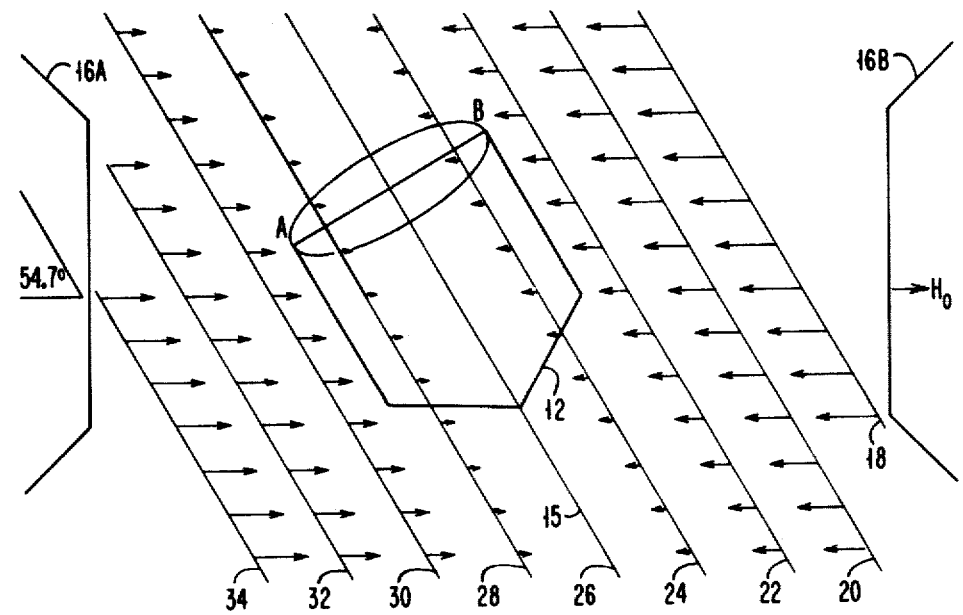
FIG. 6A-6C illustrate cross-sectional views of three different phase relationships between the sample rotation and the field gradient rotation.
Figure 6B:
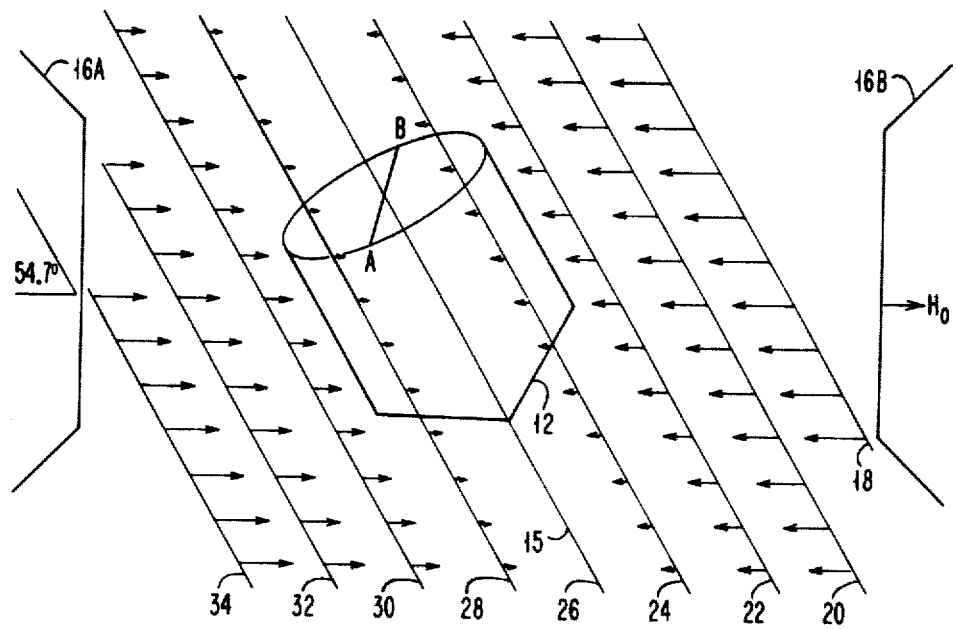
Figure 6C:
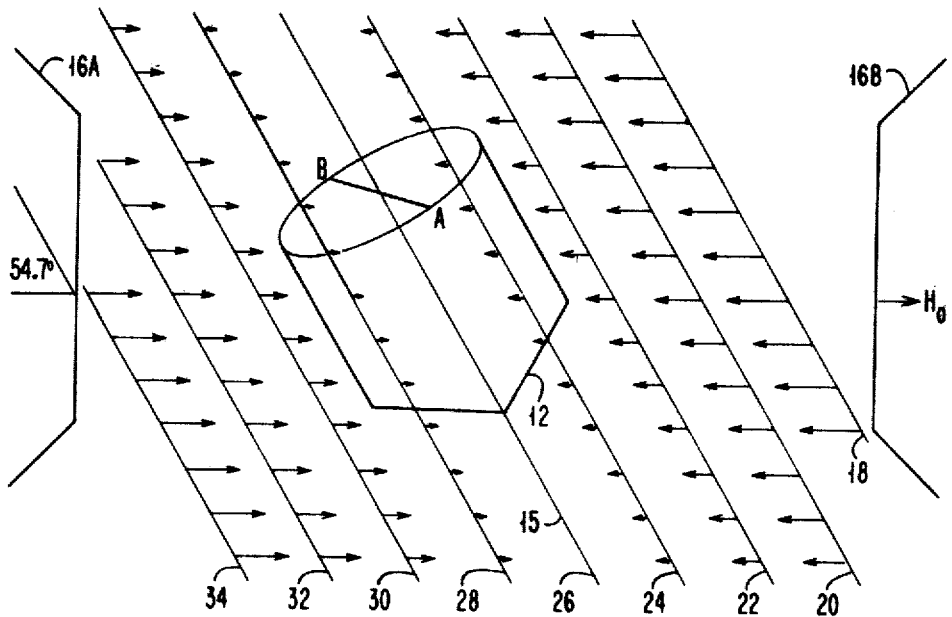

FIGS. 6A, 6B, 6C show different phase relations between the sample and field gradient. The line AB of the sample hodler 12 makes a different angle with the planes of equal field strength in each of these three figures. With each of these different angles, the data is again collected while the sample and the field gradient are synchronously rotated. The phase relation is changed a number of times and data collected each time. The spin image of the solid sample is then reconstructed from the collected data.

Industrial Applicability

The advantages of the method in accordance with this invention are an extension of spin-imaging in solids by NMR to a wider class of materials.

While I have illustrated and described the preferred embodiments of my invention, it is understood that I do not limit myself to the precise steps herein and the right is secured to allow changes and modifications coming within the scope of the invention as defined in the appended claims.

We claim:

1. A method of spin-imaging in solids using nuclear magnetic resonance in which a solid sample positioned within the field of an rf excitation coil and a static external magnetic field is rotated about an axis comprising the steps of:
   a. superimposing a specific magnetic field gradient on the static external magnetic field,
   b. rotating the magnetic field gradient synchronously with the sample,
   c. collecting data while performing solid state NMR line narrowing procedures, and
   d. changing the phase relation between the sample rotation and field gradient rotation on a step-by-step basis.

2. A method as described in claim 1 including repeating steps b and c after each phase relation change.

3. A method as described in claim 2 including reconstructing the spin image of the sample from the collected data.

4. A method of spin-imaging in solids comprising the steps of:
   placing a solid sample within the field of an rf excitation coil and the static external magnetic field of an NMR spectrometer;
   superimposing a specific magnetic field gradient in one direction on the static external magnetic field to provide different resonant NMR frequencies in different parts of the sample;
   rotating the sample about an axis which makes a particular angle with the direction of the static external magnetic field;
   rotating the magnetic field gradient synchronously with the sample;
   collecting data while performing solid state NMR line narrowing procedures, and
   changing the phase relation between the sample rotation and field-gradient rotation on a step-by-step basis to map out an image of the object.

5. A method as described in claim 4 whereby the angle is 54.7'.

6. A method as described in claim 4 whereby the magnet field gradient is linear.

* * * * *